United States Patent
Lin et al.

(10) Patent No.: US 9,362,217 B2
(45) Date of Patent: Jun. 7, 2016

(54) PACKAGE ON PACKAGE STRUCTURE AND FABRICATION METHOD THEREOF

(71) Applicant: Siliconware Precision Industries Co., Ltd., Taichung (TW)

(72) Inventors: Pang-Chun Lin, Taichung (TW); Wei-Ping Wang, Taichung (TW); Chun-Yuan Li, Taichung (TW); Shao-tzu Tang, Taichung (TW); Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/290,145

(22) Filed: May 29, 2014

(65) Prior Publication Data

US 2015/0091150 A1   Apr. 2, 2015

(30) Foreign Application Priority Data

Sep. 27, 2013   (TW) .............................. 102134972 A

(51) Int. Cl.
| | |
|---|---|
| *H01L 21/00* | (2006.01) |
| *H01L 23/498* | (2006.01) |
| *H01L 23/538* | (2006.01) |
| *H01L 25/10* | (2006.01) |

(52) U.S. Cl.
CPC ...... *H01L 23/49811* (2013.01); *H01L 23/5389* (2013.01); *H01L 25/105* (2013.01); *H01L 23/49827* (2013.01); *H01L 2224/16225* (2013.01); *H01L 2224/48091* (2013.01); *H01L 2224/48227* (2013.01); *H01L 2224/73204* (2013.01); *H01L 2225/1035* (2013.01); *H01L 2225/1058* (2013.01); *H01L 2924/15311* (2013.01)

(58) Field of Classification Search
CPC ............. H01L 222/32145; H01L 2224/16145; H01L 2225/06517; H01L 2225/10234
USPC .................. 438/107, 109, 110; 257/686, 777
See application file for complete search history.

(56) References Cited

U.S. PATENT DOCUMENTS

| | | | | |
|---|---|---|---|---|
| 8,241,955 | B2* | 8/2012 | Pagaila et al. ................. | 438/108 |
| 8,294,253 | B2* | 10/2012 | Ihara .............................. | 257/686 |
| 8,531,021 | B2* | 9/2013 | Hu et al. ........................ | 257/686 |
| 8,618,669 | B2* | 12/2013 | Furuta ............................ | 257/777 |
| 2006/0151206 | A1* | 7/2006 | Maruyama et al. ........... | 174/260 |
| 2007/0018313 | A1* | 1/2007 | Gomyo et al. ................. | 257/723 |
| 2008/0073769 | A1* | 3/2008 | Wu et al. ........................ | 257/686 |
| 2013/0175702 | A1* | 7/2013 | Choi et al. ..................... | 257/774 |
| 2015/0076691 | A1* | 3/2015 | Kim et al. ...................... | 257/738 |

* cited by examiner

*Primary Examiner* — S. V. Clark
(74) *Attorney, Agent, or Firm* — Mintz Levin Cohn Ferris Glovsky and Popeo, P.C.; Peter F. Corless; Steven M. Jensen

(57) ABSTRACT

A method for fabricating a POP structure is disclosed. First, a first package is provided, which has: a dielectric layer; a stacked circuit layer embedded in the dielectric layer and exposed from upper and lower surfaces of the dielectric layer; a plurality of conductive posts and a semiconductor chip disposed on the upper surface of the dielectric layer and electrically connected to the stacked circuit layer; and an encapsulant formed on upper surface of the dielectric layer for encapsulating the semiconductor chip and the conductive posts and having a plurality of openings for exposing top ends of the conductive posts. Then, a second package is disposed on the encapsulant and electrically connected to the conductive posts. The formation of the conductive posts facilitates to reduce the depth of the openings of the encapsulant, thereby reducing the fabrication time and increasing the production efficiency and yield.

10 Claims, 7 Drawing Sheets

PACKAGE ON PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 102134972, filed Sep. 27, 2013, the entire contents of which is incorporated herein by reference.

BACKGROUND OF THE INVENTION

1. Field of the Invention

The present invention relates to package structures and fabrication methods thereof, and more particularly, to a package on package (POP) structure and a fabrication method thereof.

2. Description of Related Art

As electronic products are developed towards miniaturization, printed circuit boards have less area available for disposing semiconductor packages. Therefore, semiconductor packages are vertically stacked to form package on package (POP) structures to meet the demands for small surface bonding area and high component density.

FIG. 1 is a schematic cross-sectional view of a conventional POP structure.

Referring to FIG. 1, two packages 11, 12 are provided. An encapsulant 111 is formed on the package 11 and then a laser ablation process is performed to form a plurality of openings 1110 in the encapsulant 111 for exposing conductive pads 112 of the package 11. Thereafter, a plurality of conductive elements 113 are formed on the conductive pads 112 in the openings 1110. Further, a plurality of solder balls 121 are formed on a lower surface of the package 12. Then, the package 12 is stacked on the package 11 and electrically connected to the conductive elements 113 of the package 11 through the solder balls 121, thereby forming a POP structure.

However, to form the openings in the encapsulant, a large laser drilling depth is required, thus increasing the fabrication time and reducing the production efficiency. Further, as I/O counts increase and the distance between the conductive pads decreases, solder bridging easily occurs during stacking of the packages, thereby reducing the product yield.

Therefore, there is a need to provide a POP structure and a fabrication method thereof so as to overcome the above-described drawbacks.

SUMMARY OF THE INVENTION

In view of the above-described drawbacks, the present invention provides a method for fabricating a POP structure, which comprises the steps of: providing a first package comprising: a dielectric layer having opposite first and second surfaces; a stacked circuit layer embedded in the dielectric layer and exposed from the first and second surfaces of the dielectric layer; a plurality of conductive posts formed on the first surface of the dielectric layer and electrically connected to the stacked circuit layer; a semiconductor chip disposed on the first surface of the dielectric layer and electrically connected to the stacked circuit layer; and an encapsulant formed on the first surface of the dielectric layer for encapsulating the semiconductor chip and the conductive posts and having a plurality of openings for exposing top ends of the conductive posts; and disposing a second package on the encapsulant and electrically connecting the second package to the conductive posts.

In an embodiment, fabricating the first package comprises: providing a carrier having opposite third and fourth surfaces and forming a first resist layer on the fourth surface of the carrier, wherein the first resist layer has a plurality of openings for exposing portions of the carrier; forming a plurality of first circuits in the openings of the first resist layer; forming a second resist layer on the first resist layer and the first circuits, wherein the second resist layer has a plurality of openings for exposing the first circuits; forming a plurality of second circuits in the openings of the second resist layer such that the first circuits and the second circuits form the stacked circuit layer; removing the first resist layer and the second resist layer; forming the dielectric layer on the fourth surface of the carrier so as to encapsulate the first circuits and the second circuits, wherein the second circuits are exposed from the second surface of the dielectric layer; removing a portion of the carrier to form a cavity in the carrier so as to expose the first circuits from the first surface of the dielectric layer and forming the conductive posts from the remaining portion of the carrier, wherein the conductive posts are electrically connected to the first circuits; disposing the semiconductor chip on the first surface of the dielectric layer and electrically connecting the semiconductor chip to the stacked circuit layer; forming the encapsulant on the first surface of the dielectric layer for encapsulating the semiconductor chip and the conductive posts; and forming the plurality of openings in the encapsulant for exposing the top ends of the conductive posts. Therein, the carrier can be made of metal or other conductive materials. The openings of the encapsulant can be formed by laser ablation.

In another embodiment, fabricating the first package comprises: providing a carrier having opposite third and fourth surfaces and forming a plurality of through holes in the carrier; forming the conductive posts in the through holes of the carrier; forming a first resist layer on the fourth surface of the carrier, wherein the first resist layer has a plurality of openings for exposing portions of the carrier and the conductive posts; forming a plurality of first circuits in the openings of the first resist layer such that the first circuits are electrically connected to the conductive posts; forming a second resist layer on the first resist layer and the first circuits, wherein the second resist layer has a plurality of openings for exposing the first circuits; forming a plurality of second circuits in the openings of the second resist layer such that the first circuits and the second circuits form the stacked circuit layer; removing the first resist layer and the second resist layer; forming the dielectric layer on the fourth surface of the carrier so as to encapsulate the first circuits and the second circuits, wherein the second circuits are exposed from the second surface of the dielectric layer; removing the carrier to expose the conductive posts and expose the first circuits from the first surface of the dielectric layer; disposing the semiconductor chip on the first surface of the dielectric layer and electrically connecting the semiconductor chip to the stacked circuit layer; forming the encapsulant on the first surface of the dielectric layer for encapsulating the semiconductor chip and the conductive posts; and forming the plurality of openings in the encapsulant for exposing the top ends of the conductive posts. Therein, the carrier can be made of metal or other conductive materials. The openings of the encapsulant can be formed by laser ablation.

In the above-described method, the second package can comprise a plurality of conductive elements for electrically connecting the second package to the top ends of the conductive posts.

In the above-described method, the conductive elements can be solder balls. After providing the first package, the method can further comprise singulating the first package.

The present invention further provides a POP structure, which comprises: a first package, comprising: a dielectric layer having opposite first and second surfaces; a stacked circuit layer embedded in the dielectric layer and exposed from the first and second surfaces of the dielectric layer; a plurality of conductive posts formed on the first surface of the dielectric layer and electrically connected to the stacked circuit layer; a semiconductor chip disposed on the first surface of the dielectric layer and electrically connected to the stacked circuit layer; and an encapsulant formed on the first surface of the dielectric layer for encapsulating the semiconductor chip and the conductive posts and having a plurality of openings for exposing top ends of the conductive posts; and a second package disposed on the encapsulant and electrically connected to the conductive posts.

In the above-described structure, the second package can comprise a plurality of conductive elements for electrically connecting the second package to the top ends of the conductive posts, and the conductive elements can be solder balls.

According to the present invention, the formation of the conductive posts facilitates to reduce the depth of the openings in the encapsulant, thereby reducing the fabrication time and increasing the production efficiency.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "on", "a" etc. are merely for illustrative purposes and should not be construed to limit the scope of the present invention.

First Embodiment

Figure 1:
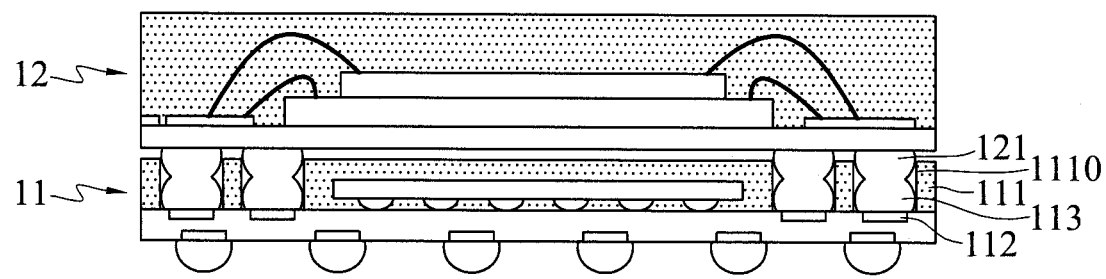
FIG. 1 is a schematic cross-sectional view of a conventional POP structure.
Figure 2A:
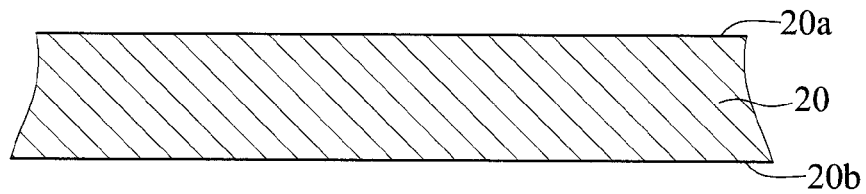
FIGS. 2A to 2N are schematic cross-sectional views showing a POP structure and a fabrication method thereof according to a first embodiment of the present invention.
Figure 2B:
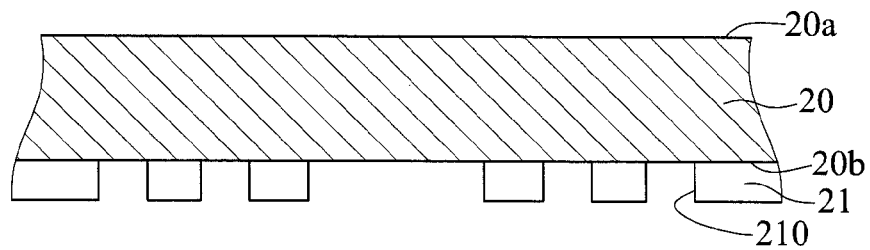
Figure 2C:
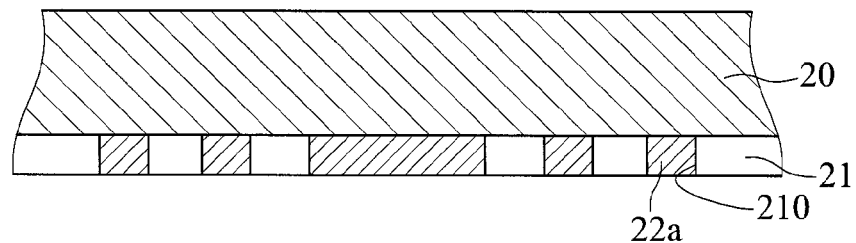
Figure 2D:
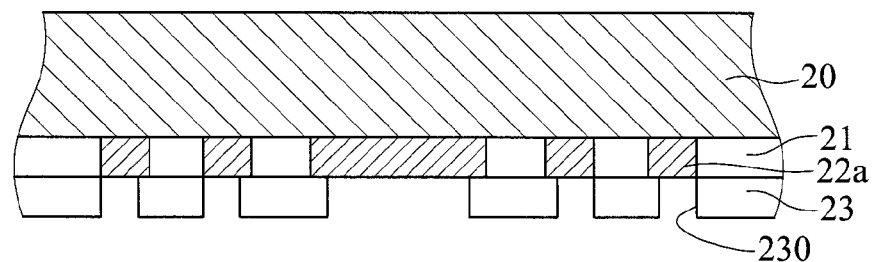
Figure 2E:
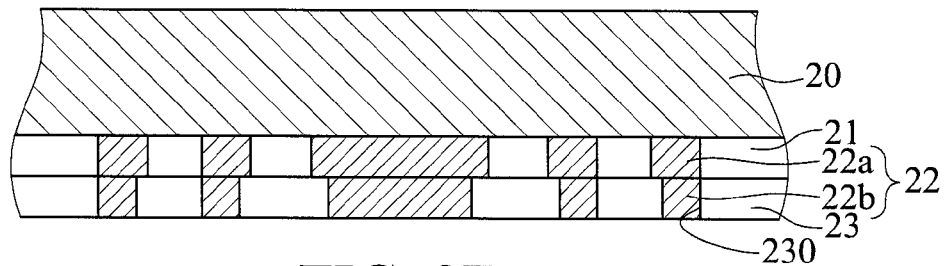
Figure 2F:
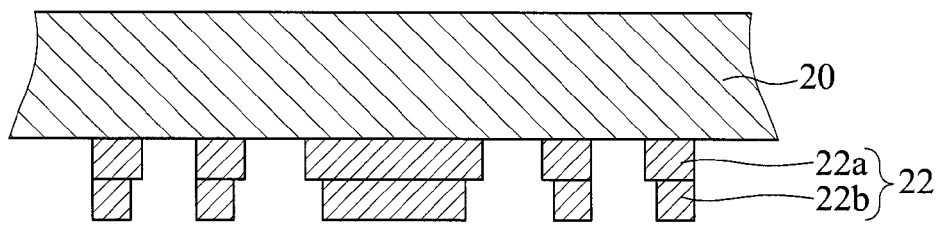
Figure 2G:
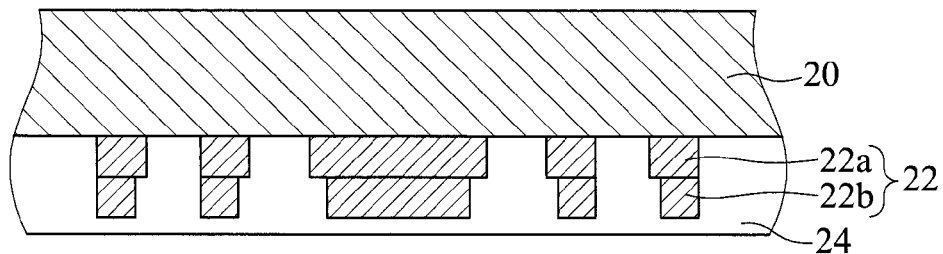
Figure 2H:
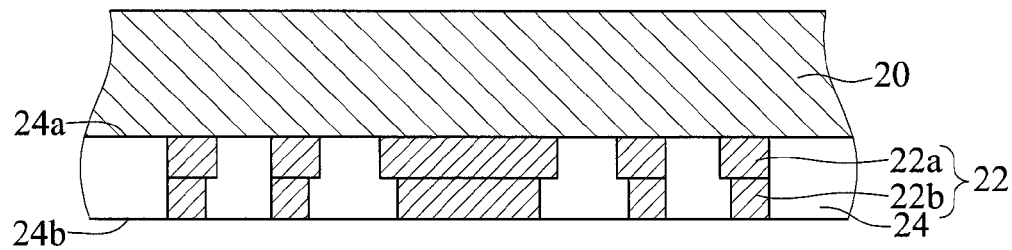
Figure 2I:
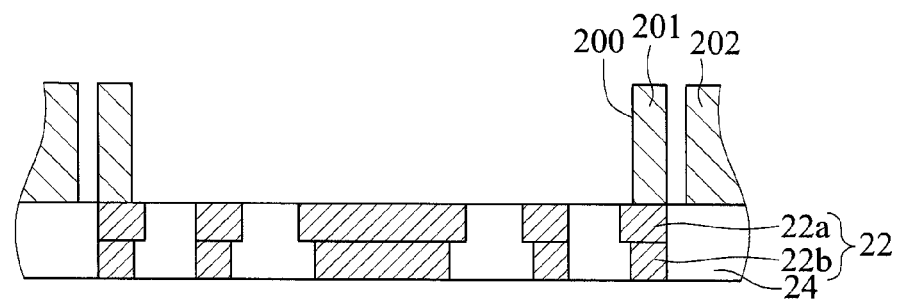
Figure 2J:
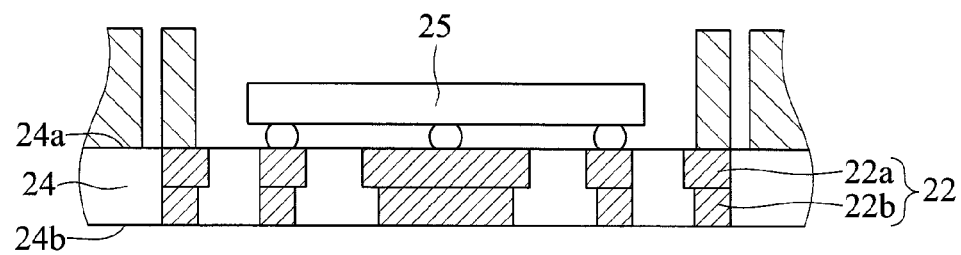
Figure 2K:
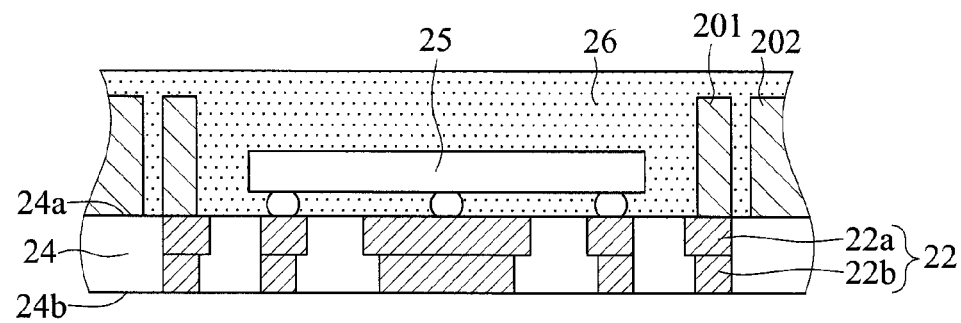
Figure 2L:
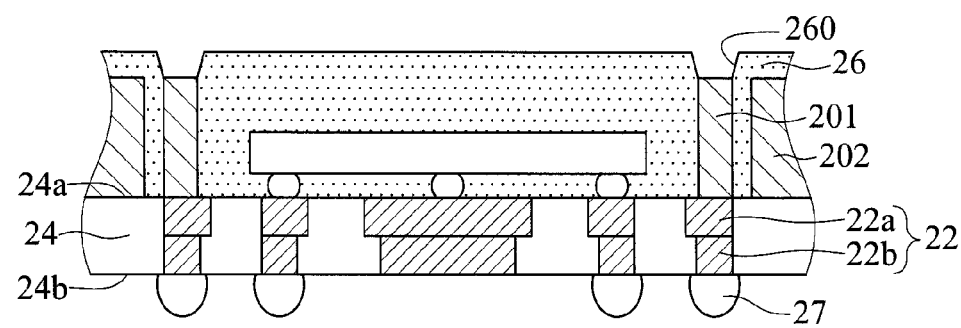
Figure 2M:
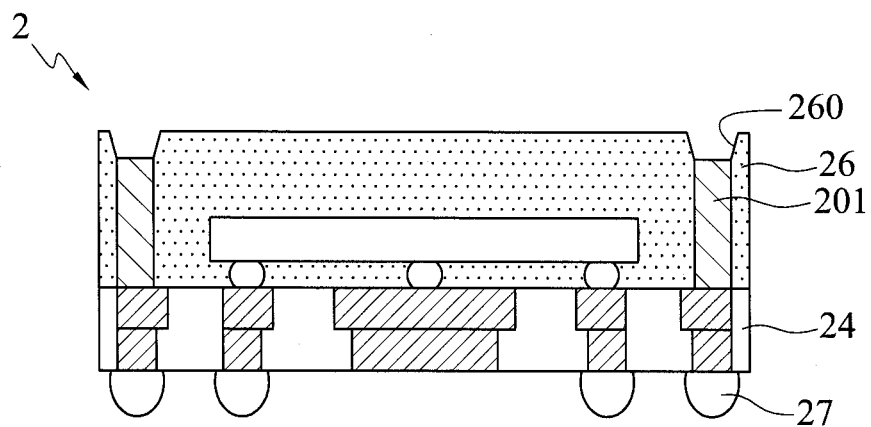
Figure 2N:
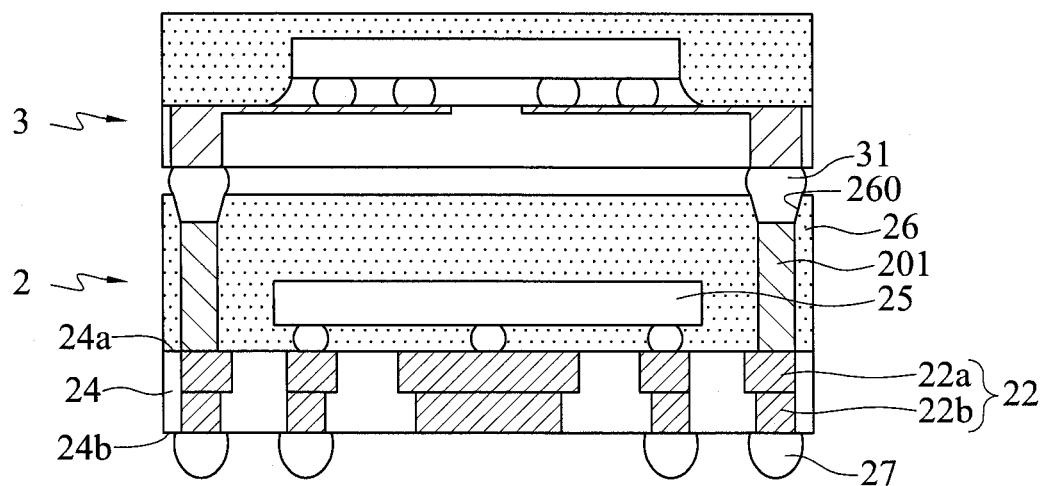

FIGS. 2A to 2N are schematic cross-sectional views showing a POP structure and a fabrication method thereof according to a first embodiment of the present invention.

Referring to FIG. 2A, a carrier 20 having a third surface 20a and a fourth surface 20b opposite to the third surface 20a is provided. The carrier 20 can be made of metal or other conductive materials. Preferably, the carrier 20 is made of iron or SPCC (steel plate coldrolled coil).

Referring to FIG. 2B, a first resist layer 21 is formed on the fourth surface 20b of the carrier 20 and has a plurality of openings 210 for exposing portions of the carrier 20.

Referring to FIG. 2C, a plurality of first circuits 22a are formed in the openings 210 of the first resist layer 21.

Referring to FIG. 2D, a second resist layer 23 is formed on the first resist layer 21 and the first circuits 22a and has a plurality of openings 230 for exposing the first circuits 22a.

Referring to FIG. 2E, a plurality of second circuits 22b are formed in the openings 230 of the second resist layer 23 such that the first circuits 22a and the second circuits 22b form a stacked circuit layer 22.

Referring to FIG. 2F, the first resist layer 21 and the second resist layer 23 are removed.

Referring to FIG. 2G, a dielectric layer 24 is formed on the fourth surface 20b of the carrier 20 for encapsulating the first circuits 22a and the second circuits 22b.

Referring to FIG. 2H, a portion of the dielectric layer 24 is removed by such as grinding. As such, the dielectric layer 24 has a first surface 24a and a second surface 24b opposite to the first surface 24a, and the second circuits 22b are exposed from the second surface 24b of the dielectric layer 24.

Referring to FIG. 2I, a cavity 200 is formed in the carrier 20 to expose the first circuits 22a from the first surface 24a of the dielectric layer 24, and a plurality of conductive posts 201 and supporting portions 202 are formed from the remaining carrier 20. Therein, the conductive posts 21 are electrically connected to the first circuits 22a. The supporting portions 202 are used for maintaining the rigidity of the overall structure. The cavity 200 can be formed by etching. Since such a technique is well known in the art, detailed description thereof is omitted therein.

Referring to FIG. 2J, a semiconductor chip 25 is disposed on the first surface 24a of the dielectric layer 24 and electrically connected to the stacked circuit layer 22.

Referring to FIG. 2K, an encapsulant 26 is formed on the first surface 24a of the dielectric layer 24 for encapsulating the semiconductor chip 25, the conductive posts 201 and the supporting portions 202.

Referring to FIG. 2L, a plurality of openings 260 are formed in the encapsulant 26 by laser ablation so as to expose top ends of the conductive posts 201, and a plurality of solder balls 27 are formed on the second circuits 22b exposed from the second surface 24b of the dielectric layer 24.

Referring to FIG. 2M, a singulation process is performed to remove the supporting portions 202 to form a first package 2.

Referring to FIG. 2N, a second package 3 is disposed on the first package 2 and electrically connected to the top ends of the conductive posts 201 of the first package 2 through a plurality of conductive elements 31. The conductive elements 31 can be, for example, solder balls.

Second Embodiment

FIGS. 3A to 3G are schematic cross-sectional views showing a method for fabricating a first package of a POP structure according to a second embodiment of the present invention.

Figure 3A:
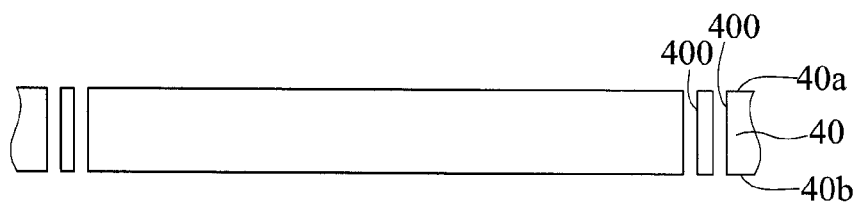
FIGS. 3A to 3G are schematic cross-sectional views showing a method for fabricating a first package of a POP structure according to a second embodiment of the present invention.

Referring to FIG. 3A, a carrier 40 having a third surface 40a and a fourth surface 40b opposite to the third surface 40a is provided, and a plurality of through holes 400 are formed in the carrier 40. The carrier 40 can be made of metal or other conductive materials. Preferably, the carrier 40 is made of iron or SPCC.

Figure 3B:

Referring to FIG. 3B, a plurality of conductive posts 41 are formed in the through holes 400 of the carrier 40.

Figure 3C:
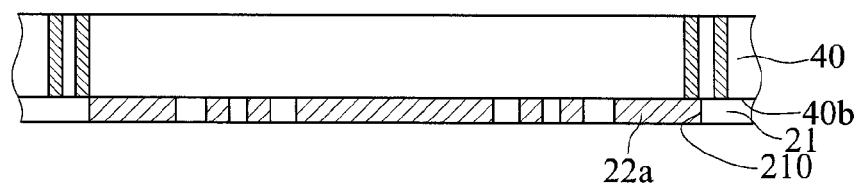

Referring to FIG. 3C, a first resist layer 21 is formed on the fourth surface 40b of the carrier 40 and has a plurality of openings 210 for exposing portions of the carrier 40 and the conductive posts 41. Then, a plurality of first circuits 22a are formed in the openings 210 of the first resist layer 21 and electrically connected to the conductive posts 41.

Figure 3D:
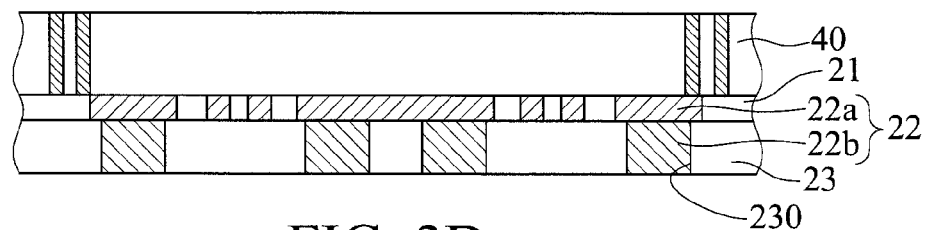

Referring to FIG. 3D, a second resist layer 23 is formed on the first resist layer 21 and the first circuits 22a and has a plurality of openings 230 for exposing the first circuits 22a. Then, a plurality of second circuits 22b are formed in the openings 230 of the second resist layer 23 such that the first circuits 22a and the second circuits 22b form a stacked circuit layer 22.

Figure 3E:
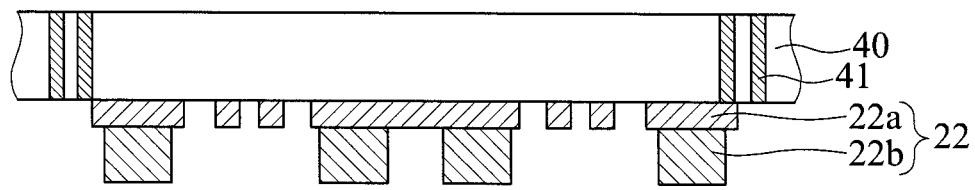

Referring to FIG. 3E, the first resist layer 21 and the second resist layer 23 are removed.

Figure 3F:
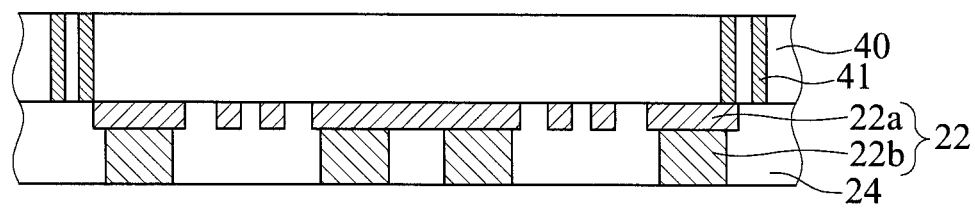

Referring to FIG. 3F, a dielectric layer 24 is formed on the fourth surface 40b of the carrier 40 for encapsulating the first circuits 22a and the second circuits 22b. The dielectric layer 24 has opposite first and second surfaces 24a, 24b, and the second circuits 22b are exposed from the second surface 24b of the dielectric layer 24.

Figure 3G:
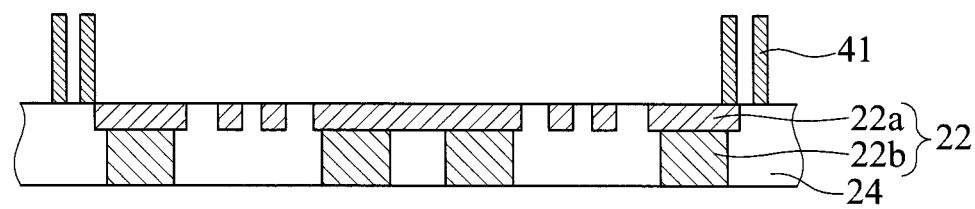

Referring to FIG. 3G, the carrier 40 is removed to expose the conductive posts 41 and expose the first circuits 22a from the first surface 24a of the dielectric layer 24. Then, the steps of FIGS. 2J to 2N can be performed to form a POP structure.

The present invention further provides a POP structure having a first package 2 and a second package 3. The first package 2 has: a dielectric layer 24 having opposite first and second surfaces 24a, 24b; a stacked circuit layer 22 embedded in the dielectric layer 24 and exposed from the first and second surfaces 24a, 24b; a plurality of conductive posts 201 formed on the first surface 24a of the dielectric layer 24 and electrically connected to the stacked circuit layer 22; a semiconductor chip 25 disposed on the first surface 24a of the dielectric layer 24 and electrically connected to the stacked circuit layer 22; and an encapsulant 26 formed on the first surface 24a of the dielectric layer 24 for encapsulating the semiconductor chip 25 and the conductive posts 201 and having a plurality of openings 260 for exposing top ends of the conductive posts 201. The second package 3 is disposed on the encapsulant 26 and electrically connected to the conductive posts 201.

In an embodiment, the second package 3 further has a plurality of conductive elements 31 electrically connected to the top ends of the conductive posts 201. The conductive elements 31 are solder balls.

Further, a surface processing layer (not shown) made of such as Ni/Au or an OSP (organic solderability preservative) layer (not shown) can be formed on the exposed surfaces of the stacked circuit layer 22. Since related techniques are well known in the art, detailed description thereof is omitted herein.

According the present invention, the formation of the conductive posts facilitates to reduce the depth of the openings in the encapsulant, thereby reducing the fabrication time and increasing the production efficiency. Further, the present invention allows the conductive elements electrically connecting the first and second packages to have a small size. As such, the overall stacking thickness is reduced. In addition, the risk of solder bridging is reduced and therefore the product yield is increased. Furthermore, by replacing the conventional packaging substrate with the stacked circuit layer, the present invention reduces the thickness of the overall package structure.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a POP structure, comprising the steps of:
    providing a first package fabricated by:
        providing a carrier having opposite third and fourth surfaces and forming a first resist layer on the fourth surface of the carrier, wherein the first resist layer has a plurality of openings for exposing portions of the carrier;
        forming a plurality of first circuits in the openings of the first resist layer;
        forming a second resist layer on the first resist layer and the first circuits, wherein the second resist layer has a plurality of openings for exposing the first circuits;
        forming a plurality of second circuits in the openings of the second resist layer such that the first circuits and the second circuits form a stacked circuit layer;
        removing the first resist layer and the second resist layer;
        forming a dielectric layer on the fourth surface of the carrier so as to encapsulate the first circuits and the second circuits, wherein the second circuits are exposed from a second surface of the dielectric layer;
        removing a portion of the carrier to form a cavity in the carrier so as to expose the first circuits from a first surface of the dielectric layer and forming a plurality of conductive posts from a remaining portion of the carrier, wherein the conductive posts are electrically connected to the first circuits;
        disposing a semiconductor chip on the first surface of the dielectric layer and electrically connecting the semiconductor chip to the stacked circuit layer;
        forming an encapsulant on the first surface of the dielectric layer for encapsulating the semiconductor chip and the conductive posts; and
        forming a plurality of openings in the encapsulant for exposing top ends of the conductive posts; and
    disposing a second package on the encapsulant and electrically connecting the second package to the conductive posts.

2. The method of claim 1, wherein the carrier is made of metal or other conductive materials.

3. The method of claim 1, wherein the openings of the encapsulant are formed by laser ablation.

4. A method for fabricating a POP structure, comprising the steps of:
    providing a first package fabricated by:
        providing a carrier having opposite third and fourth surfaces and forming a plurality of through holes in the carrier;
        forming a plurality of conductive posts in the through holes of the carrier;
        forming a first resist layer on the fourth surface of the carrier, wherein the first resist layer has a plurality of openings for exposing portions of the carrier and the conductive posts;
        forming a plurality of first circuits in the openings of the first resist layer such that the first circuits are electrically connected to the conductive posts;
        forming a second resist layer on the first resist layer and the first circuits, wherein the second resist layer has a plurality of openings for exposing the first circuits;
        forming a plurality of second circuits in the openings of the second resist layer such that the first circuits and the second circuits form a stacked circuit layer;

removing the first resist layer and the second resist layer;

forming a dielectric layer on the fourth surface of the carrier so as to encapsulate the first circuits and the second circuits, wherein the second circuits are exposed from a second surface of the dielectric layer;

removing the carrier to expose the conductive posts and expose the first circuits from a first surface of the dielectric layer;

disposing a semiconductor chip on the first surface of the dielectric layer and electrically connecting the semiconductor chip to the stacked circuit layer;

forming an encapsulant on the first surface of the dielectric layer for encapsulating the semiconductor chip and the conductive posts; and forming a plurality of openings in the encapsulant for exposing the top ends of the conductive posts; and disposing a second package on the encapsulant and electrically connecting the second package to the conductive posts.

5. The method of claim 4, wherein the carrier is made of metal or other conductive materials.

6. The method of claim 4, wherein the openings of the encapsulant are formed by laser ablation.

7. The method of claim 1, wherein the second package comprises a plurality of conductive elements for electrically connecting the second package to the top ends of the conductive posts.

8. The method of claim 7, wherein the conductive elements are solder balls.

9. The method of claim 4, wherein the second package comprises a plurality of conductive elements for electrically connecting the second package to the top ends of the conductive posts.

10. The method of claim 9, wherein the conductive elements are solder balls.

\* \* \* \* \*